US012690457B2

(12) United States Patent
Flemming et al.

(10) Patent No.: US 12,690,457 B2
(45) Date of Patent: Jul. 21, 2026

(54) THERMAL TRANSFER, MANAGEMENT AND INTEGRATED CONTROL STRUCTURE

(71) Applicant: 3D Glass Solutions, Inc., Albuquerque, NM (US)

(72) Inventors: Jeb H. Flemming, Albuquerque, NM (US); Jeff A. Bullington, Orlando, FL (US); Kyle McWethy, Albuquerque, NM (US)

(73) Assignee: 3D Glass Solutions, Inc., Albuquerque, NM (US)

( * ) Notice: Subject to any disclaimer, the term of this patent is extended or adjusted under 35 U.S.C. 154(b) by 918 days.

(21) Appl. No.: 17/858,512

(22) Filed: Jul. 6, 2022

(65) Prior Publication Data

US 2023/0025988 A1    Jan. 26, 2023

Related U.S. Application Data

(60) Provisional application No. 63/222,274, filed on Jul. 15, 2021.

(51) Int. Cl.
H10W 40/25        (2026.01)
H05K 1/02        (2006.01)
H10W 20/41        (2026.01)

(52) U.S. Cl.
CPC ........ H10W 40/259 (2026.01); H05K 1/0206 (2013.01); H05K 1/0209 (2013.01);
(Continued)

(58) Field of Classification Search
CPC ............ H01L 21/311; H01L 21/30625; H01L 21/308; H10P 50/283; H10P 50/693
See application file for complete search history.

(56) References Cited

U.S. PATENT DOCUMENTS

| | | | |
|---|---|---|---|
| 2,515,937 | A | 7/1950 | Stookey |
| 2,515,940 | A | 7/1950 | Stookey |

(Continued)

FOREIGN PATENT DOCUMENTS

| | | |
|---|---|---|
| CN | 1562831 A | 4/2004 |
| CN | 105938928 | 9/2016 |

(Continued)

OTHER PUBLICATIONS

International Search Report and Written Opinion for PCT/US2022/42516 dated Feb. 3, 2023 by the USPTO, 22 pp.

(Continued)

*Primary Examiner* — Thomas T Pham
(74) *Attorney, Agent, or Firm* — Edwin S. Flores; Daniel J. Chalker; Chalker Flores, LLP

(57)        ABSTRACT

The present invention includes a method of making a thermal management and signal control structure comprising forming in a substrate heat conductive vias and control vias, power vias, and ground vias, wherein the heat conductive vias and the control vias, power vias, and vias are aligned to a first metal plate on a first side of the substrate, wherein the control vias, power vias, and ground vias are surrounded by a glass layer; forming a second metal plate on a second side of the substrate, wherein the second metal plate is connected to the heat conductive vias; and forming a pad on each of the control vias, power vias, and ground vias, wherein each pad is configured to electrically connect the thermal management and signal control structure to at least one of: a printed circuit board, an integrated circuit, or a power management unit.

15 Claims, 3 Drawing Sheets

(52) U.S. Cl.
CPC .... *H10W 20/427* (2026.01); *H05K 2201/093*
(2013.01); *H05K 2201/1056* (2013.01)

(56) References Cited

U.S. PATENT DOCUMENTS

| | | | |
|---|---|---|---|
| 2,515,941 A | 7/1950 | Stookey |
| 2,515,943 A | 7/1950 | Stookey |
| 2,628,160 A | 2/1953 | Stookey |
| 2,684,911 A | 7/1954 | Stookey |
| 2,971,853 A | 2/1961 | Stookey |
| 3,281,264 A | 10/1966 | Cape et al. |
| 3,292,115 A | 12/1966 | La Rosa |
| 3,904,991 A | 9/1975 | Ishli et al. |
| 3,985,531 A | 10/1976 | Grossman |
| 3,993,401 A | 11/1976 | Strehlow |
| 4,029,605 A | 6/1977 | Kosiorek |
| 4,131,516 A | 12/1978 | Bakos et al. |
| 4,413,061 A | 11/1983 | Kumar |
| 4,444,616 A | 4/1984 | Fujita et al. |
| 4,514,053 A | 4/1985 | Borrelli et al. |
| 4,537,612 A | 8/1985 | Borrelli et al. |
| 4,611,882 A | 9/1986 | Susumu |
| 4,647,940 A | 3/1987 | Traut et al. |
| 4,692,015 A | 9/1987 | Loce et al. |
| 4,788,165 A | 11/1988 | Fong et al. |
| 4,942,076 A | 7/1990 | Panicker et al. |
| 5,078,771 A | 1/1992 | Wu |
| 5,136,366 A | 8/1992 | Worp et al. |
| 5,147,740 A | 9/1992 | Robinson |
| 5,212,120 A | 5/1993 | Araujo et al. |
| 5,215,610 A | 6/1993 | Dipaolo et al. |
| 5,312,674 A | 5/1994 | Heartling et al. |
| 5,352,996 A | 10/1994 | Kawaguchi |
| 5,371,466 A | 12/1994 | Arakawa et al. |
| 5,374,291 A | 12/1994 | Yabe et al. |
| 5,395,498 A | 3/1995 | Gombinsky et al. |
| 5,409,741 A | 4/1995 | Laude |
| 5,733,370 A | 3/1998 | Chen et al. |
| 5,779,521 A | 7/1998 | Muroyama et al. |
| 5,850,623 A | 12/1998 | Carman, Jr. et al. |
| 5,902,715 A | 5/1999 | Tsukamoto et al. |
| 5,919,607 A | 7/1999 | Lawandy et al. |
| 5,998,224 A | 12/1999 | Rohr et al. |
| 6,046,641 A | 4/2000 | Chawla et al. |
| 6,066,448 A | 5/2000 | Wohlstadter et al. |
| 6,094,336 A | 7/2000 | Weekamp |
| 6,136,210 A | 10/2000 | Biegelsen et al. |
| 6,171,886 B1 | 1/2001 | Ghosh |
| 6,236,290 B1 | 5/2001 | Abe et al. |
| 6,258,497 B1 | 7/2001 | Kropp et al. |
| 6,287,965 B1 | 9/2001 | Kang et al. |
| 6,329,702 B1 | 12/2001 | Gresham et al. |
| 6,373,369 B2 | 4/2002 | Huang et al. |
| 6,383,566 B1 | 5/2002 | Zagdoun |
| 6,417,754 B1 | 7/2002 | Bernhardt et al. |
| 6,485,690 B1 | 11/2002 | Pfost et al. |
| 6,495,411 B1 | 12/2002 | Mei |
| 6,511,793 B1 | 1/2003 | Cho et al. |
| 6,514,375 B2 | 2/2003 | Kijima |
| 6,562,523 B1 | 5/2003 | Wu et al. |
| 6,678,453 B2 | 1/2004 | Bellman et al. |
| 6,686,824 B1 | 2/2004 | Yamamoto et al. |
| 6,771,860 B2 | 8/2004 | Trezza et al. |
| 6,783,920 B2 | 8/2004 | Livingston et al. |
| 6,824,974 B2 | 11/2004 | Pisharody et al. |
| 6,830,221 B1 | 12/2004 | Janson et al. |
| 6,843,902 B1 | 1/2005 | Penner et al. |
| 6,875,544 B1 | 4/2005 | Sweatt et al. |
| 6,932,933 B2 | 8/2005 | Helvajian et al. |
| 6,977,722 B2 | 12/2005 | Wohlstadter et al. |
| 7,033,821 B2 | 4/2006 | Kim et al. |
| 7,064,045 B2 | 6/2006 | Yang |
| 7,132,054 B1 | 11/2006 | Kravitz et al. |
| 7,179,638 B2 | 2/2007 | Anderson |
| 7,277,151 B2 | 10/2007 | Ryu et al. |
| 7,306,689 B2 | 12/2007 | Okubora et al. |
| 7,326,538 B2 | 2/2008 | Pitner et al. |
| 7,407,768 B2 | 8/2008 | Yamazaki et al. |
| 7,410,763 B2 | 8/2008 | Su et al. |
| 7,439,128 B2 | 10/2008 | Divakaruni |
| 7,470,518 B2 | 12/2008 | Chiu et al. |
| 7,497,554 B2 | 3/2009 | Okuno |
| 7,603,772 B2 | 10/2009 | Farnworth et al. |
| 7,915,076 B2 | 3/2011 | Ogawa et al. |
| 7,948,342 B2 | 5/2011 | Long |
| 8,062,753 B2 | 11/2011 | Schreder et al. |
| 8,076,162 B2 | 12/2011 | Flemming et al. |
| 8,096,147 B2 | 1/2012 | Flemming et al. |
| 8,361,333 B2 | 1/2013 | Flemming et al. |
| 8,492,315 B2 | 7/2013 | Flemming et al. |
| 8,709,702 B2 | 4/2014 | Flemming et al. |
| 9,385,083 B1 | 7/2016 | Herrault et al. |
| 9,449,753 B2 | 9/2016 | Kim |
| 9,635,757 B1 | 4/2017 | Chen et al. |
| 9,755,305 B2 | 9/2017 | Desclos et al. |
| 9,819,991 B1 | 11/2017 | Rajagopalan et al. |
| 9,843,083 B2 | 12/2017 | Cooper et al. |
| 10,070,533 B2 | 9/2018 | Flemming et al. |
| 10,201,901 B2 | 2/2019 | Flemming et al. |
| 10,665,377 B2 | 5/2020 | Flemming et al. |
| 10,854,946 B2 | 12/2020 | Flemming et al. |
| 10,903,545 B2 | 1/2021 | Flemming et al. |
| 11,076,489 B2 | 7/2021 | Flemming et al. |
| 11,101,532 B2 | 8/2021 | Flemming et al. |
| 11,139,582 B2 | 10/2021 | Flemming et al. |
| 11,161,773 B2 | 11/2021 | Flemming et al. |
| 11,264,167 B2 | 3/2022 | Flemming et al. |
| 11,270,843 B2 | 3/2022 | Flemming et al. |
| 11,342,896 B2 | 5/2022 | Flemming et al. |
| 11,367,939 B2 | 6/2022 | Flemming et al. |
| 11,524,807 B2 | 12/2022 | Gentili et al. |
| 11,594,457 B2 | 2/2023 | Flemming et al. |
| 11,677,373 B2 | 6/2023 | Flemming et al. |
| 11,894,594 B2 | 2/2024 | Flemming et al. |
| 11,929,199 B2 | 3/2024 | Flemming et al. |
| 11,962,057 B2 | 4/2024 | Flemming et al. |
| 2001/0051584 A1 | 12/2001 | Harada et al. |
| 2002/0015546 A1 | 2/2002 | Bhagavatula |
| 2002/0086246 A1 | 7/2002 | Lee |
| 2002/0100608 A1 | 8/2002 | Fushie et al. |
| 2003/0025227 A1 | 2/2003 | Daniell |
| 2003/0107459 A1 | 6/2003 | Takahashi et al. |
| 2003/0124716 A1 | 7/2003 | Hess et al. |
| 2003/0135201 A1 | 7/2003 | Gonnelli |
| 2003/0143802 A1 | 7/2003 | Chen et al. |
| 2003/0156819 A1 | 8/2003 | Pruss et al. |
| 2003/0174944 A1 | 9/2003 | Dannoux |
| 2003/0228682 A1 | 12/2003 | Lakowicz et al. |
| 2003/0231076 A1 | 12/2003 | Takeuchi et al. |
| 2003/0231830 A1 | 12/2003 | Hikichi |
| 2004/0008391 A1 | 1/2004 | Bowley et al. |
| 2004/0020690 A1 | 2/2004 | Parker et al. |
| 2004/0058504 A1 | 3/2004 | Kellar et al. |
| 2004/0104449 A1 | 6/2004 | Yoon |
| 2004/0155748 A1 | 8/2004 | Steingroever |
| 2004/0171076 A1 | 9/2004 | Dejneka et al. |
| 2004/0184705 A1 | 9/2004 | Shimada et al. |
| 2004/0198582 A1 | 10/2004 | Borrelli et al. |
| 2004/0227596 A1 | 11/2004 | Nguyen et al. |
| 2005/0089901 A1 | 4/2005 | Porter et al. |
| 2005/0105860 A1 | 5/2005 | Oono |
| 2005/0111162 A1 | 5/2005 | Osaka et al. |
| 2005/0118779 A1 | 6/2005 | Ahn |
| 2005/0150683 A1 | 7/2005 | Farnworth et al. |
| 2005/0170670 A1 | 8/2005 | King et al. |
| 2005/0194628 A1 | 9/2005 | Kellar et al. |
| 2005/0212432 A1 | 9/2005 | Neil et al. |
| 2005/0277550 A1 | 12/2005 | Brown et al. |
| 2006/0092079 A1 | 5/2006 | Rochemont |
| 2006/0118965 A1 | 6/2006 | Matsui |
| 2006/0147344 A1 | 7/2006 | Ahn et al. |
| 2006/0158300 A1 | 7/2006 | Korony et al. |
| 2006/0159916 A1 | 7/2006 | Dubrow et al. |
| 2006/0171033 A1 | 8/2006 | Shreder et al. |

(56)                References Cited

U.S. PATENT DOCUMENTS

| | | |
|---|---|---|
| 2006/0177855 A1 | 8/2006 | Utermohlen et al. |
| 2006/0188907 A1 | 8/2006 | Lee et al. |
| 2006/0193214 A1 | 8/2006 | Shimano et al. |
| 2006/0201201 A1 | 9/2006 | Fushie et al. |
| 2006/0283948 A1 | 12/2006 | Naito |
| 2007/0023386 A1 | 2/2007 | Kravitz et al. |
| 2007/0034910 A1 | 2/2007 | Shie |
| 2007/0120263 A1 | 5/2007 | Gabric et al. |
| 2007/0121263 A1 | 5/2007 | Liu et al. |
| 2007/0155021 A1 | 7/2007 | Zhang et al. |
| 2007/0158787 A1 | 7/2007 | Chanchani |
| 2007/0248126 A1 | 10/2007 | Liu et al. |
| 2007/0254490 A1 | 11/2007 | Jain |
| 2007/0267708 A1 | 11/2007 | Courcimault |
| 2007/0272829 A1 | 11/2007 | Nakagawa et al. |
| 2007/0279837 A1 | 12/2007 | Chow et al. |
| 2007/0290782 A1 | 12/2007 | Yokoyama et al. |
| 2007/0296520 A1 | 12/2007 | Hosokawa et al. |
| 2008/0042785 A1 | 2/2008 | Yagisawa |
| 2008/0079565 A1 | 4/2008 | Koyama |
| 2008/0090332 A1 | 4/2008 | Cheng et al. |
| 2008/0136572 A1 | 6/2008 | Ayasi et al. |
| 2008/0174976 A1 | 7/2008 | Satoh et al. |
| 2008/0182079 A1 | 7/2008 | Mirkin et al. |
| 2008/0223603 A1 | 9/2008 | Kim et al. |
| 2008/0226228 A1 | 9/2008 | Tamurar |
| 2008/0231402 A1 | 9/2008 | Jow et al. |
| 2008/0245109 A1 | 10/2008 | Flemming et al. |
| 2008/0291442 A1 | 11/2008 | Lawandy |
| 2008/0305268 A1 | 12/2008 | Norman et al. |
| 2008/0316678 A1 | 12/2008 | Ehrenberg et al. |
| 2009/0029185 A1 | 1/2009 | Lee et al. |
| 2009/0075478 A1 | 3/2009 | Matsui |
| 2009/0130736 A1 | 5/2009 | Collis et al. |
| 2009/0170032 A1 | 7/2009 | Takahashi et al. |
| 2009/0182720 A1 | 7/2009 | Cain et al. |
| 2009/0200540 A1 | 8/2009 | Bjoerk et al. |
| 2009/0243783 A1 | 10/2009 | Fouquet et al. |
| 2009/0290281 A1 | 11/2009 | Nagamoto et al. |
| 2009/0305502 A1 | 12/2009 | Lee et al. |
| 2010/0009838 A1 | 1/2010 | Muraki |
| 2010/0022416 A1 | 1/2010 | Flemming et al. |
| 2010/0044089 A1 | 2/2010 | Shibuya et al. |
| 2010/0059265 A1 | 3/2010 | Kim |
| 2010/0159191 A1* | 6/2010 | Imai .................... H01L 21/6836 |
| | | 428/131 |
| 2010/0237462 A1 | 9/2010 | Beker et al. |
| 2011/0003422 A1 | 1/2011 | Katragadda et al. |
| 2011/0045284 A1 | 2/2011 | Matsukawa et al. |
| 2011/0065662 A1 | 3/2011 | Rinsch et al. |
| 2011/0084371 A1 | 4/2011 | Rotay et al. |
| 2011/0086606 A1 | 4/2011 | Chen et al. |
| 2011/0108525 A1 | 5/2011 | Chien et al. |
| 2011/0114496 A1 | 5/2011 | Dopp et al. |
| 2011/0115051 A1 | 5/2011 | Kim et al. |
| 2011/0170273 A1 | 7/2011 | Helvajian |
| 2011/0195360 A1 | 8/2011 | Flemming et al. |
| 2011/0217657 A1 | 9/2011 | Flemming et al. |
| 2011/0284725 A1 | 11/2011 | Goldberg |
| 2011/0304999 A1 | 12/2011 | Yu et al. |
| 2012/0080612 A1 | 4/2012 | Grego |
| 2012/0161330 A1 | 6/2012 | Hlad et al. |
| 2013/0001770 A1 | 1/2013 | Liu |
| 2013/0015467 A1 | 1/2013 | Krumbein et al. |
| 2013/0015578 A1 | 1/2013 | Thacker et al. |
| 2013/0105941 A1 | 5/2013 | Vanslette et al. |
| 2013/0119401 A1 | 5/2013 | D'evelyn et al. |
| 2013/0142998 A1 | 6/2013 | Flemming et al. |
| 2013/0143381 A1 | 6/2013 | Kikukawa |
| 2013/0183805 A1 | 7/2013 | Wong et al. |
| 2013/0207745 A1 | 8/2013 | Yun et al. |
| 2013/0209026 A1 | 8/2013 | Doany et al. |
| 2013/0233202 A1 | 9/2013 | Cao et al. |
| 2013/0278568 A1 | 10/2013 | Lasiter et al. |
| 2013/0308906 A1 | 11/2013 | Zheng et al. |
| 2013/0337604 A1 | 12/2013 | Ozawa et al. |
| 2014/0002906 A1 | 1/2014 | Shibuya |
| 2014/0035540 A1 | 2/2014 | Ehrenberg |
| 2014/0035892 A1 | 2/2014 | Shenoy |
| 2014/0035935 A1 | 2/2014 | Shenoy |
| 2014/0070380 A1 | 3/2014 | Chiu et al. |
| 2014/0104284 A1 | 4/2014 | Shenoy et al. |
| 2014/0104288 A1 | 4/2014 | Shenoy et al. |
| 2014/0144681 A1 | 5/2014 | Pushparaj et al. |
| 2014/0145326 A1 | 5/2014 | Lin et al. |
| 2014/0169746 A1 | 6/2014 | Hung et al. |
| 2014/0203891 A1 | 7/2014 | Yazaki |
| 2014/0247269 A1 | 9/2014 | Berdy et al. |
| 2014/0272688 A1 | 9/2014 | Dillion |
| 2014/0367695 A1 | 12/2014 | Barlow |
| 2015/0035638 A1 | 2/2015 | Stephanou et al. |
| 2015/0048901 A1 | 2/2015 | Rogers |
| 2015/0062825 A1 | 3/2015 | Ossimitz et al. |
| 2015/0071593 A1 | 3/2015 | Kanke |
| 2015/0210074 A1 | 7/2015 | Chen et al. |
| 2015/0228712 A1 | 8/2015 | Yun |
| 2015/0263429 A1 | 9/2015 | Vahidpour et al. |
| 2015/0277047 A1* | 10/2015 | Flemming ............... C03C 15/00 |
| | | 216/26 |
| 2016/0048079 A1 | 2/2016 | Lee et al. |
| 2016/0079437 A1 | 3/2016 | Ochi et al. |
| 2016/0099684 A1 | 4/2016 | Qiu et al. |
| 2016/0111359 A1 | 4/2016 | Chen et al. |
| 2016/0152505 A1 | 6/2016 | Fushie |
| 2016/0181211 A1 | 6/2016 | Kamgaing et al. |
| 2016/0185653 A1 | 6/2016 | Fushie |
| 2016/0254579 A1 | 9/2016 | Mills |
| 2016/0265974 A1 | 9/2016 | Erte et al. |
| 2016/0268665 A1 | 9/2016 | Sherrer et al. |
| 2016/0320568 A1 | 11/2016 | Haase |
| 2016/0380614 A1 | 12/2016 | Abbott et al. |
| 2017/0003421 A1 | 1/2017 | Flemming et al. |
| 2017/0077892 A1 | 3/2017 | Thorup |
| 2017/0094794 A1 | 3/2017 | Flemming et al. |
| 2017/0098501 A1 | 4/2017 | Flemming et al. |
| 2017/0213762 A1 | 7/2017 | Gouk et al. |
| 2017/0370870 A1 | 12/2017 | Fomina et al. |
| 2018/0310399 A1 | 10/2018 | Nair et al. |
| 2018/0315811 A1 | 11/2018 | Cho et al. |
| 2018/0323485 A1 | 11/2018 | Gnanou et al. |
| 2019/0093233 A1 | 3/2019 | Flemming et al. |
| 2019/0177213 A1 | 6/2019 | Flemming et al. |
| 2019/0190464 A1 | 6/2019 | Peyrot et al. |
| 2019/0280079 A1 | 9/2019 | Bouvier et al. |
| 2020/0060513 A1 | 2/2020 | Ito et al. |
| 2020/0066443 A1 | 2/2020 | Lu et al. |
| 2020/0119255 A1 | 4/2020 | Then et al. |
| 2020/0168536 A1 | 5/2020 | Link et al. |
| 2020/0211985 A1 | 7/2020 | Pietambaram et al. |
| 2020/0227470 A1 | 7/2020 | Then et al. |
| 2020/0235020 A1 | 7/2020 | Boek |
| 2020/0252074 A1 | 8/2020 | Healy et al. |
| 2020/0275558 A1 | 8/2020 | Fujita |
| 2020/0312767 A1* | 10/2020 | Pietambaram .... H01L 23/49894 |
| 2021/0013303 A1 | 1/2021 | Chen et al. |
| 2021/0271275 A1 | 9/2021 | Kim et al. |
| 2021/0313282 A1 | 10/2021 | Noori et al. |
| 2022/0157524 A1 | 5/2022 | Flemming et al. |
| 2022/0359337 A1* | 11/2022 | Moreira ............... H01L 23/367 |
| 2022/0377904 A1 | 11/2022 | Flemming et al. |

FOREIGN PATENT DOCUMENTS

| | | |
|---|---|---|
| CN | 10-2019-0126254 | 11/2019 |
| CN | 210668058 U | 6/2020 |
| DE | 102004059252 A1 | 1/2006 |
| EP | 0311274 A2 | 12/1989 |
| EP | 0507719 A1 | 10/1992 |
| EP | 0685857 B1 | 12/1995 |
| EP | 0949648 A1 | 10/1999 |
| EP | 1487019 A1 | 12/2004 |
| EP | 1683571 A1 | 6/2006 |
| GB | 619779 A | 3/1949 |
| GB | 1407151 | 9/1975 |

(56) References Cited

FOREIGN PATENT DOCUMENTS

| | | | |
|---|---|---|---|
| JP | 56-155587 | | 12/1981 |
| JP | 61149905 | | 7/1986 |
| JP | 61231529 | A | 10/1986 |
| JP | 62202840 | | 9/1987 |
| JP | 63-128699 | A | 6/1988 |
| JP | H393683 | A | 4/1991 |
| JP | 05139787 | A | 6/1993 |
| JP | 08179155 | | 12/1994 |
| JP | 08026767 | | 1/1996 |
| JP | H10007435 | A | 1/1998 |
| JP | 10199728 | A | 7/1998 |
| JP | 11344648 | A | 12/1999 |
| JP | 2000114818 | A | 4/2000 |
| JP | 2000228615 | A | 8/2000 |
| JP | 2001033664 | A | 2/2001 |
| JP | 2001284533 | A | 10/2001 |
| JP | 2005302987 | A | 10/2005 |
| JP | 2005215644 | | 11/2005 |
| JP | 2006032982 | A | 2/2006 |
| JP | 2006179564 | A | 6/2006 |
| JP | 2006324489 | A | 11/2006 |
| JP | 2008252797 | A | 10/2008 |
| JP | 2011192836 | A | 9/2011 |
| JP | 2012079960 | A | 4/2012 |
| JP | 2013-077809 | A | 4/2013 |
| JP | 2013062473 | A | 4/2013 |
| JP | 2013217989 | A | 10/2013 |
| JP | 2014241365 | A | 12/2014 |
| JP | 2015028651 | A | 2/2015 |
| JP | H08026767 | A | 1/2016 |
| JP | 2018200912 | A | 12/2018 |
| JP | 2020174169 | A | 10/2020 |
| JP | 2021145131 | A | 9/2021 |
| KR | 1020040001906 | B1 | 1/2004 |
| KR | 1020050000923 | | 1/2005 |
| KR | 20060092643 | A | 8/2006 |
| KR | 100941691 | A | 2/2010 |
| KR | 101167691 | B1 | 7/2012 |
| KR | 101519760 | | 5/2015 |
| WO | 2005027606 | A1 | 3/2005 |
| WO | 2007088058 | A1 | 8/2007 |
| WO | 2008119080 | A1 | 10/2008 |
| WO | 2008154931 | A1 | 12/2008 |
| WO | 2009029733 | A2 | 3/2009 |
| WO | 2009062011 | A1 | 5/2009 |
| WO | 2009126649 | A2 | 10/2009 |
| WO | 2010011939 | A2 | 1/2010 |
| WO | 2011100445 | A1 | 8/2011 |
| WO | 2011109648 | A1 | 9/2011 |
| WO | 2012078213 | A1 | 6/2012 |
| WO | 2014043267 | A1 | 3/2014 |
| WO | 2014062226 | A1 | 4/2014 |
| WO | 2014062311 | A2 | 4/2014 |
| WO | 2014193525 | A1 | 12/2014 |
| WO | 2015108648 | A1 | 7/2015 |
| WO | 2015171597 | A1 | 11/2015 |
| WO | 2017132280 | A2 | 8/2017 |
| WO | 2018209422 | A1 | 11/2018 |

OTHER PUBLICATIONS

International Search Report and Written Opinion for PCT/US2023/010118 dated Apr. 5, 2023 by the USPTO, 12 pp.

International Search Report and Written Opinion for PCT/US2017/026662 dated Jun. 5, 2017, 11 pp.

International Search Report and Written Opinion for PCT/US2018/029559 dated Aug. 3, 2018, 9 pp.

International Search Report and Written Opinion for PCT/US2018/039841 dated Sep. 20, 2018 by Australian Patent Office, 12 pp.

International Search Report and Written Opinion for PCT/US2018/065520 dated Mar. 20, 2019 by Australian Patent Office, 11 pp.

International Search Report and Written Opinion for PCT/US2018/068184 dated Mar. 19, 2019 by Australian Patent Office, 11 pp.

International Search Report and Written Opinion for PCT/US2019/024496 dated Jun. 20, 2019 by Australian Patent Office, 9 pp.

International Search Report and Written Opinion for PCT/US2019/34245 dated Aug. 9, 2019 by Australian Patent Office, 10 pp.

International Search Report and Written Opinion for PCT/US2019/50644 dated Dec. 4, 2019 by USPTO, 9 pp.

International Search Report and Written Opinion for PCT/US2019/068586 dated Mar. 12, 2020 by USPTO, 10 pp.

International Search Report and Written Opinion for PCT/US2019/068590 dated Mar. 5, 2020 by USPTO, 9 pp.

International Search Report and Written Opinion for PCT/US2019/068593 dated Mar. 16, 2020 by USPTO, 8 pp.

International Search Report and Written Opinion for PCT/US2020/026673 dated Jun. 22, 2020, by the USPTO, 13 pp.

International Search Report and Written Opinion for PCT/US2020/28474 dated Jul. 17, 2020 by the USPTO, 7 pp.

International Search Report and Written Opinion for PCT/US2020/54394 dated Jan. 7, 2021 by the USPTO, 15 pp.

International Search Report and Written Opinion for PCT/US2021/21371 dated May 20, 2021 by the USPTO, 10 pp.

International Search Report and Written Opinion for PCT/US2021/27499 dated Jun. 16, 2021 by the USPTO, 7 pp.

International Technology Roadmap for Semiconductors, 2007 Edition, "Assembly and Packaging," 9 pages.

Kamagaing, et al., "Investigation of a photodefinable glass substrate for millimeter-wave radios on package," Proceeds of the 2014 IEEE 64th Electronic Components and Technology Conference, May 27, 2014, pp. 1610-1615.

Lakowicz, et al; "Advances in Surface-Enhanced Fluorescence", J Fluorescence, (2004), 14:425-441.

Lewis, Sr., "Hawley's Condensed Chemical Dictionary." 13th ed, 1997, John Wiley and Sons. p. 231.

Lin, C.H., et al., "Fabrication of Microlens Arrays in Photosensitive Glass by Femtosecond Laser Direct Writing," Appl Phys A (2009) 97:751-757.

Livingston, F.E., et al., "Effect of Laser Parameters on the Exposure and Selective Etch Rate in Photostructurable Glass," SPIE vol. 4637 (2002); pp. 404-412.

Lyon, L.A., et al., "Raman Spectroscopy," Anal Chem (1998), 70:341R-361R.

Mohamedelhassan, A., "Fabrication of Ridge Waveguides in Lithium Niobate," Independent thesis Advanced level, KTH, School of Engineering Sciences, Physics, 2012, 68 pp.

Muharram, B., Thesis from University of Calgary Graduate Studies, "Substrate-Integrated Waveguide Based Antenna in Remote Respiratory Sensing," 2012, 97 pp.

Papapolymerou, I., et al., "Micromachined patch antennas," IEEE Transactions on Antennas and Propagation, vol. 46, No. 2, 1998, pp. 275-283.

Perro, A., et al., "Design and synthesis of Janus micro- and nanoparticles," J Mater Chem (2005), 15:3745-3760.

Quantum Leap, "Liquid Crystal Polymer (LCP) LDMOS Packages," Quantum Leap Datasheet, (2004), mlconnelly.com/QLPKG. Final_LDMOS_DataSheet.pdf, 2 pages.

Scrantom, Charles Q., "LTCC Technology—Where We Are and Where We're Going—IV," Jun. 2000, 12 pages.

TechNote #205, Bangs Laboratories, www.bangslabs.com/technotes/205.pdf, "Covalent Coupling".

TechNote #104, Bangs Laboratories, www.bangslabs.com/technotes/104.pdf, "Silica Microspheres".

TechNote #201, Bangs Laboratories, www.bangslabs.com/technotes/201.pdf, "Working with Microspheres".

Topper, et al., "Development of a high density glass interposer based on wafer level packaging technologies," 2014 IEEE 64th Electronic Components and Technology Conference, May 27, 2014, pp. 1498-1503.

Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.

Zhang, H., et al., "Biofunctionalized Nanoarrays of Inorganic Structures Prepared by Dip-Pen Nanolithography," Nanotechnology (2003), 14:1113-1117.

(56) References Cited

OTHER PUBLICATIONS

Zhang, H., et al., Synthesis of Hierarchically Porous Silica and Metal Oxide Beads Using Emulsion-Templated Polymer Scaffolds, Chem Mater (2004), 16:4245-4256.

Extended European Search Report for EP 19906040.1 dated Feb. 4, 2022, 16 pp.

International Search Report and Written Opinion for PCT/US2017/019483 dated May 19, 2017, 11 pp.

International Search Report and Written Opinion for PCT/US2013/059305 dated Jan. 10, 2014, 6 pp.

International Search Report and Written Opinion for PCT/US2015/012758 dated Apr. 8, 2015, 11 pp.

International Search Report and Written Opinion for PCT/US2015/029222 dated Jul. 22, 2015, 9 pp.

Optics 101, "What is a Halogen Lamp?", Apr. 25, 2014, p. 1-2.

European Search Report and Supplemental European Search Report for EP 19905255.6 dated Jul. 26, 2022, 8 pp.

Aslan, et al, "Metal-Enhanced Fluorescence: an emerging tool in biotechnology" Current opinion in Biotechnology (2005), 16:55-62.

Azad, I., et al., "Design and Performance Analysis of 2.45 GHz Microwave Bandpass Filter with Reduced Harmonics," International Journal of Engineering Research and Development (2013), 5(11):57-67.

Bakir, Muhannad S., et al., "Revolutionary Nanosilicon Ancillary Technologies for Ultimate-Performance Gigascale Systems," IEEE 2007 Custom Integrated Circuits Conference (CICC), 2007, pp. 421-428.

Beke, S., et al., "Fabrication of Transparent and Conductive Microdevices," Journal of Laser Micro/Nanoengineering (2012), 7(1):28-32.

Brusberg, et al. "Thin Glass Based Packaging Technologies for Optoelectronic Modules" Electronic Components and Technology Conference, May 26-29, 2009, pp. 207-212, DOI:10.1109/ECTC.2009.5074018, pp. 208-211; Figures 3, 8.

Cheng, et al. "Three-dimensional Femtosecond Laser Integration in Glasses" The Review of Laser Engineering, vol. 36, 2008, pp. 1206-1209, Section 2, Subsection 3.1.

Chou, et al., "Design and Demonstration of Micro-mirrors and Lenses for Low Loss and Low Cost Single-Mode Fiber Coupling in 3D Glass Photonic Interposers," 2016 IEEE 66th Electronic Components and Technology Conference, May 31-Jun. 3, 7 pp.

Chowdhury, et al, "Metal-Enhanced Chemiluminescence", J Fluorescence (2006), 16:295-299.

Crawford, Gregory P., "Flexible Flat Panel Display Technology," John Wiley and Sons, NY, (2005), 9 pages.

Dang, et al. "Integrated thermal-fluidic I/O interconnects for an on-chip microchannel heat sink," IEEE Electron Device Letters, vol. 27, No. 2, pp. 117-119, 2006.

Dietrich, T.R., et al., "Fabrication Technologies for Microsystems Utilizing Photoetchable Glass," Microelectronic Engineering 30, (1996), pp. 407-504.

Extended European Search Report 15741032.5 dated Aug. 4, 2017, 11 pp.

Extended European Search Report 15789595.4 dated Mar. 31, 2017, 7 pp.

Extended European Search Report 17757365.6 dated Oct. 14, 2019, 14 pp.

Extended European Search Report 17744848.7 dated Oct. 30, 2019, 9 pp.

European Search Report and Supplemental European Search Report for EP 18828907 dated Mar. 25, 2020, 11 pp.

European Search Report and Supplemental European Search Report for EP 18889385.3 dated Dec. 2, 2020, 8 pp.

European Search Report and Supplemental European Search Report for EP 18898912.3 dated Feb. 2, 2021, 10 pp.

European Search Report and Supplemental European Search Report for EP 19784673.6 dated Feb. 2, 2021, 8 pp.

European Search Report and Supplemental European Search Report for EP 19811031.4 dated Feb. 26, 2021, 7 pp.

European Search Report and Supplemental European Search Report for EP 19861556.9 dated Jan. 18, 2022, 9 pp.

Geddes, et al, "Metal-Enhanced Fluorescence" J Fluorescence, (2002), 12:121-129.

Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.

Green, S., "Heterogeneous Integration of DARPA: Pathfinding and Progress in Assembly Approaches," viewed on and retrieved from the Internet on Feb. 26, 2021, <URL:https://web.archive.org/web/20181008153224/https://www.ectc.net/files/68/Demmin%20Darpa.pdf>, published Oct. 8, 2018 per the Wayback Machine.

Grine, F. et al., "High-Q Substrate Integrated Waveguide Resonator Filter With Dielectric Loading," IEEE Access vol. 5, Jul. 12, 2017, pp. 12526-12532.

Hyeon, I-J, et al., "Millimeter-Wave Substrate Integrated Waveguide Using Micromachined Tungsten-Coated Through Glass Silicon Via Structures," Micromachines, vol. 9, 172 Apr. 9, 2018, 9 pp.

Intel Corporation, "Intel® 82566 Layout Checklist (version 1.0)", 2006.

International Search Report and Written Opinion for PCT/US2008/058783 dated Jul. 1, 2008, 15 pp.

International Search Report and Written Opinion for PCT/US2008/074699 dated Feb. 26, 2009, 11 pp.

International Search Report and Written Opinion for PCT/US2009/039807 dated Nov. 24, 2009, 13 pp.

International Search Report and Written Opinion for PCT/US2009/051711 dated Mar. 5, 2010, 15 pp.

International Search Report and Written Opinion for PCT/US2011/024369 dated Mar. 25, 2011, 13 pp.

Kuo Che-Chung et al: "Performance Comparison of Flip-Chip-Assembled 5-GHz 0.18-um CMOS Power Amplifiers on Different Packaging Substrates", IEEE Transactions on Components, Packaging and Manufacturing Technology, IEEE, USA, vol. 3, No. 12, Dec. 1, 2013 (Dec. 1, 2013), pp. 2014-2021.

Supplementary European Search Repor for EP 21768296.2 dated May 5, 2023, 10 pp.

European Search Report and Supplemental European Search Report for EP 21787618.4 dated Jul. 28, 2023, 10 pp.

International Search Report and Written Opinion for PCT/US2023/064364 dated Sep. 27, 2023, by USPTO 11 ps.

International Search Report and Written Opinion for PCT/US2023/17311 dated Aug. 14, 2023 by the USPTO, 16 pp.

European Search Report and Supplemental European Search Report for EP 19905255.6 dated Aug. 4, 2022, 8 pp.

European Search Report and Supplemental European Search Report for EP 20783596.8 dated Oct. 26, 2022, 13 pp.

European Search Report and Supplemental European Search Report for EP 20877664.1 dated Oct. 28, 2022, 10 pp.

Flemming, J.H., et al., "Cost Effective 3D Glass Microfabrication for Advanced RF Packages," Microwave Journal, Apr. 14, 2014, 12 pp.

Foster, T., "High-Q RF Devices in APEX Glass," Jun. 21, 2018, https://nanopdf.com/download/high-q-rf-devices-in-apex-glass_pdf, retrieved on Oct. 3, 2022, 8 pp.

International Search Report and Written Opinion for PCT/US2022/31993 dated Sep. 9, 2022 by the USPTO, 9 pp.

International Search Report and Written Opinion for PCT/US2022/29442 dated Oct. 6, 2022 by the USPTO, 20 pp.

Kim, Dongsu, et al., "A Compact and Low-profile GaN Power Amplifier Using Interposer-based MMCI Technology," 2014 IEEE 16th Electronics Packaging Technology Conference, pp. 672-675.

Baraban et al. "Electroluminescence of Si—SiO2—Si3N4 Structures" Technical Physics Letters, vol. 28, No. 12, 2002, pp. 978-980; Dec. 2002.

* cited by examiner

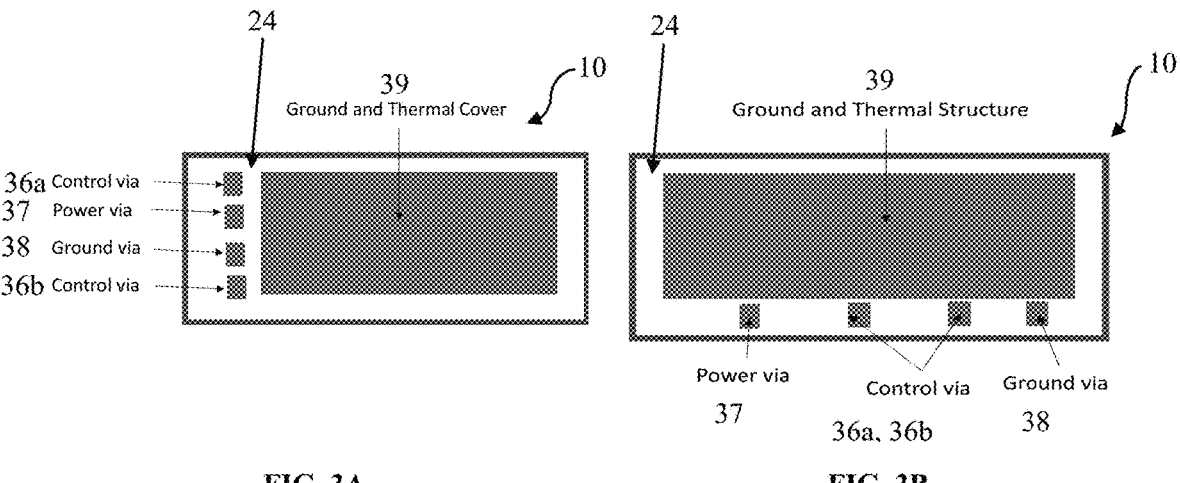
FIG. 3A                    FIG. 3B
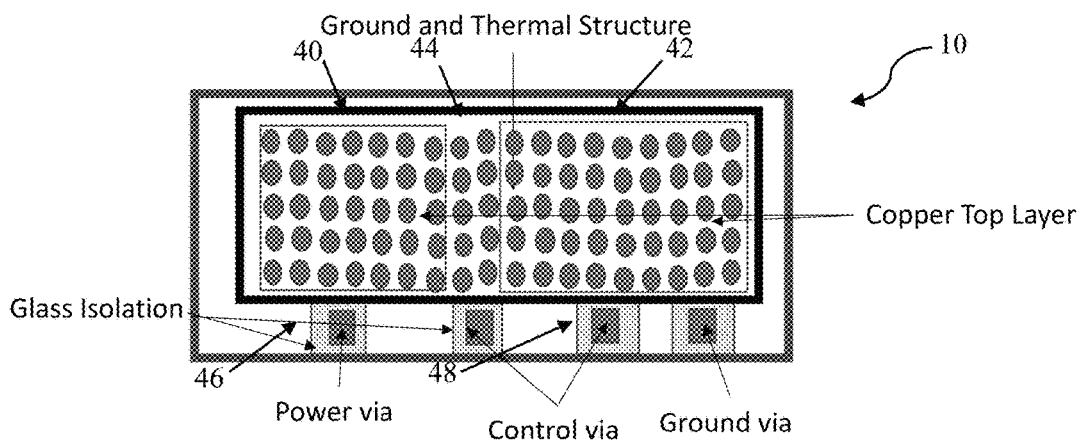
FIG. 4

THERMAL TRANSFER, MANAGEMENT AND INTEGRATED CONTROL STRUCTURE

CROSS-REFERENCE TO RELATED APPLICATIONS

This application claims the benefit of U.S. Provisional Application No. 63/222,274, filed Jul. 15, 2021, the contents of which are incorporated by reference in their entirety.

STATEMENT OF FEDERALLY FUNDED RESEARCH

None.

TECHNICAL FIELD OF THE INVENTION

The present invention relates to creating a novel heat exchanger and thermal transfer device that is integrated directly into and/or on a substrate.

BACKGROUND OF THE INVENTION

Heat exchanger and thermal transfer devices are critical for the effective operation of integrated circuits. Most CPUs generate 100 watts of heat per centimeter squared and if this heat is not effectively dissipated the integrated circuit will experience thermal runaway. Thermal runaway occurs when an increase in temperature changes the conditions in a way that causes a further increase in temperature. In semiconductor devices, increasing the temperature will decrease the junction height in a transistor. The function of semiconductor or other electrical junctions are reduced as a function temperature. The reduced junction enables more electrons to flow across it, thereby increasing the heat generated in the circuit causing an uncontrolled positive feedback. The additional heat continues to further reduce the junction height until the circuit fails catastrophically.

Industry has addressed this by creating fins that clamp or are glued on the semiconductor package with air flow to remove the heat. In some high-power applications such as servers and/or pump diodes, the industry has shifted to exotic substrates to spread the heat including the use of diamond, copper, graphite and graphene combined with active cooling using thermal electric devices, recirculating chilled liquid, or evaporative cooling. The system level solution generally increases the size and reduces the portability of electronic systems.

Thus, what is needed are novel devices that have improved heat dissipation that use thermal electric devices, recirculation chilled liquid, or evaporative cooling, without the need to use exotic materials or active cooling systems.

SUMMARY OF THE INVENTION

In one embodiment, the present invention includes a method of making a thermal management and signal control structure comprising: forming in a substrate one or more heat conductive vias and at least one of one or more control vias, one or more power vias, and one or more ground vias, wherein the one or more heat conductive vias and the at least one of one or more control vias, one or more power vias, and one or more ground vias are aligned to a first metal plate on a first side of the substrate, wherein the at least one of one or more control vias, one or more power vias, and one or more ground vias are electrically conductive and are surrounded by a glass layer; forming a second metal plate on a second side of the substrate, wherein the second metal plate is connected to the one or more heat conductive vias; and forming a pad on each via of the at least one of one or more control vias, one or more power vias, and one or more ground vias, wherein each pad is configured to electrically connect the thermal management and signal control structure to at least one of: a printed circuit board, an integrated circuit, or a power management unit. In one aspect, the substrate is a photodefinable glass, a semiconductor, a ceramic, a sapphire, or a photodefinable material. In another aspect, the substrate is a photodefinable glass substrate comprising a composition of: 60 to 76 weight % silica; at least 3 weight % $K_2O$ with 6 to 16 weight % of a combination of $K_2O$ and $Na_2O$; 0.003 to 1 weight % of at least one oxide selected from the group consisting of $Ag_2O$ and $Au_2O$; 0.003 to 2 weight % $Cu_2O$; 0.75 to 7 weight % $B_2O_3$, and 6 to 7 weight % $Al_2O_3$; and the combination of $B_2O_3$; and $Al_2O_3$ not exceeding 13 weight %; 8 to 15 weight % $Li_2O$; and 0.001 to 0.1 weight % $CeO_2$. In another aspect, the substrate is a photodefinable glass substrate comprising a composition of: 35 to 76 weight % silica, 3 to 16 weight % $K_2O$, 0.003 to 1 weight % $Ag_2O$, 8 to 15 weight % $Li_2O$, and 0.001 to 0.1 weight % $CeO_2$. In another aspect, the substrate is at least one of: a photodefinable glass substrate comprising at least 0.1 weight % $Sb_2O_3$ or $As_2O_3$; a photodefinable glass substrate comprising 0.003 to 1 weight % $Au_2O$; or a photodefinable glass substrate comprising 1 to 18 weight % of an oxide selected from the group consisting of CaO, ZnO, PbO, MgO, SrO and BaO; and a photodefinable glass substrate having an anisotropic-etch ratio of exposed portion to unexposed portion of at least one of 10 to 20:1; 21 to 29:1; 30 to 45:1; 20 to 40:1; 41 to 45:1; and 30 to 50:1. In another aspect, the substrate is a photodefinable glass ceramic composite substrate comprising at least one of silica, lithium oxide, aluminum oxide, or cerium oxide. In another aspect, the method further comprises forming the thermal management and signal control structure into a feature of at least one or more electronic circuits, or one or more passive and active components to form a bandpass filter, a low-pass filter, a high-pass filter, a shunt or a notch filter. In another aspect, a center-to-center spacing between the heat conductive vias on the substrate is 10, 20, 25, 30, 35, 40, 50, 60, 70, 75, 80, 90, 100, 125, 150, 175, 200, 225 or 250 μm, wherein each heat conductive via has a diameter of 5, 10, 20, 25, 30, 35, 40, 50, 60, 70, 75, 80, 90, 100, 125, 150, 175, to 200, μm, and wherein each heat conductive via has a via depth of 25, 30, 35, 40, 50, 60, 70, 75, 80, 90, 100, 125, 150, 175, 200, 225, 250, 300, 400, 500, 600, 800, 900, or 1000 μm. In another aspect, a center-to-center spacing of the at least one of one or more control vias, one or more power vias, and one or more ground vias is from 10, 20, 25, 30, 35, 40, 50, 60, 70, 75, 80, 90, 100, 125, 150, 175, 200, 225 or 250 μm. In another aspect, the metal layer, the heat conductive vias, and the at least one of one or more control vias, one or more power vias, and one or more ground vias comprise Cu or Al. In another aspect, the first and second metal plates, the one or more heat conductive vias, and the at least one of one or more control vias, one or more power vias, and one or more ground vias have a thickness of 100, 200, 300, 400, 500, 600, 700, 800, 900, or 1,000 nm. In another aspect, an embodiment is a thermal management and control structure made by this method.

In another embodiment, the present invention includes a method of making a thermal management and electrical connectivity structure comprising: forming on a first side of a photodefinable glass (PDG) substrate one or more heat conductive vias and at least one of one or more control vias, one or more power vias, and one or more ground vias, by: forming a first patterned photoresist layer with one or more first via patterns on the first side of the PDG substrate, exposing the first patterned photoresist layer to a UV energy to activate exposed portions of the PDG substrate, removing the first patterned photoresist layer, and baking the PDG substrate to convert the exposed portions of the PDG substrate to a ceramic phase to form ceramic vias in the PDG substrate; forming on a second side of the PDG substrate the one or more heat conductive vias and the at least one of one or more control vias, one or more power vias, and one or more ground vias, by: forming a second patterned photoresist layer with the one or more via patterns on the second side of the PDG substrate, wherein the one or more second via patterns on the second side are aligned with the one or more first via patterns on the first side, exposing the second patterned photoresist layer to a UV energy that activates exposed portions of the PDG substrate, removing the second patterned photoresist layer, chemically etching the second side of the PDG substrate to remove the ceramic vias down to the metal plate pattern on the second side of the PDG substrate, depositing a first titanium adhesion layer on the PDG substrate, depositing a copper layer on the first titanium adhesion layer, and electroplating the PDG substrate to fill the one or more heat conductive vias and the at least one of one or more control vias, one or more power vias, and one or more ground vias with copper to form copper vias; forming on the first side of the PDG substrate a heat conductive plate by: forming a third patterned photoresist layer and, depositing a second titanium adhesion layer the first side of the PDG substrate; depositing a copper layer on the second titanium adhesion layer to form the heat conductive plate and to connect the one or more heat conductive vias formed on the first side to the heat conductive plate on the PDG substrate; and etching away any remaining ceramic and glass to expose the copper vias and form air cavities therebetween, wherein a glass column surrounds and provides at least one of electrical isolation or mechanical support to the at least one of one or more control vias, one or more power vias, and one or more ground vias. In one aspect, the PDG substrate is a semiconductor, ceramic, sapphire, or a photodefinable material. In another aspect, the PDG substrate comprises a composition of: 60- to 76 weight % silica; at least 3 weight % $K_2O$ with 6 to 16 weight % of a combination of $K_2O$ and $Na_2O$; 0.003 to 1 weight % of at least one oxide selected from the group consisting of $Ag_2O$ and $Au_2O$; 0.003 to 2 weight % $Cu_2O$; 0.75 to 7 weight % $B_2O_3$, and 6 to 7 weight % $Al_2O_3$; and the combination of $B_2O_3$; and $Al_2O_3$ not exceeding 13 weight %; 8 to 15 weight % $Li_2O$; and 0.001 to 0.1 weight % $CeO_2$. In another aspect, the PDG substrate comprises a composition of: 35 to 76 weight % silica, 3 to 16 weight % $K_2O$, 0.003 to 1 weight % $Ag_2O$, 8 to 15 weight % $Li_2O$, and 0.001 to 0.1 weight % $CeO_2$. In another aspect, the PDG substrate is at least one of: a PDG substrate comprising at least 0.1 weight % $Sb_2O_3$ or $As_2O_3$; a PDG substrate comprising 0.003 to 1 weight % $Au_2O$; or a PDG substrate comprising 1 to 18 weight % of an oxide selected from the group consisting of CaO, ZnO, PbO, MgO, SrO and BaO; and a PDG substrate having an anisotropic-etch ratio of exposed portion to the unexposed portion of at least one of 10 to 20:1; 21 to 29:1; 30 to 45:1; 20 to 40:1; 41 to 45:1; and 30 to 50:1. In another aspect, the PDG substrate is a photosensitive glass ceramic composite substrate comprising at least one of silica, lithium oxide, aluminum oxide, or cerium oxide. In another aspect, the method further comprises forming the thermal management and electrical connectivity structure into a feature of at least one or more electronic circuits, or one or more passive and active components to form a bandpass filter, a low-pass filter, a high-pass filter, a shunt, or a notch filter. In another aspect, a center-to-center spacing between the one or more heat conductive vias is 10, 20, 25, 30, 35, 40, 50, 60, 70, 75, 80, 90, 100, 125, 150, 175, 200, 225 or 250 μm, wherein each heat conductive via has a diameter of 5, 10, 20, 25, 30, 35, 40, 50, 60, 70, 75, 80, 90, 100, 125, 150, 175, to 200 μm, and wherein each heat conductive via has a via depth of 25, 30, 35, 40, 50, 60, 70, 75, 80, 90, 100, 125, 150, 175, 200, 225, 250, 300, 400, 500, 600, 800, 900, or 1000 μm. In another aspect, a center-to-center spacing of the at least one of one or more control vias, the one or more power vias, and the one or more ground vias is from 10, 20, 25, 30, 35, 40, 50, 60, 70, 75, 80, 90, 100, 125, 150, 175, 200, 225 or 250 μm for the control, power and ground via patterns. In another aspect, the metal layer, the heat conductive vias, the at least one of one or more control vias, the one or more power vias, and the one or more ground vias comprise Cu or Al. In another aspect, the metal layer, the heat conductive vias, the at least one of one or more control vias, the one or more power vias, and the one or more ground vias have a thickness of 100, 200, 300, 400, 500, 600, 700, 800, 900, or 1,000 nm. In another aspect, the method further comprises forming a pad on each of the at least one of one or more control vias, one or more power vias, and one or more ground vias on the first and second side of the PDG substrate. In another aspect, the method further comprises electrically connecting each pad on the first and second sides of the thermal management and electrical connectivity structure to at least one of: a printed circuit board, an integrated circuit, or a power management unit. In another aspect, an embodiment is a thermal management and signal control structure made by this method.

In another embodiment, the present invention includes a method of making a thermal management and electrical connectivity structure comprising: forming on a first side of a photodefinable glass (PDG) substrate a first patterned photoresist layer with one or more first via patterns that comprise one or more heat conductive vias and at least one of one or more control vias, one or more power vias, and one or more ground vias, wherein the one or more first via patterns are aligned to a metal plate pattern on the first side of the PDG substrate; exposing the first side of the PDG substrate on which the first patterned photoresist layer has been formed to a UV energy that activates portions of the PDG substrate exposed to the UV energy; baking the PDG substrate to convert the UV-exposed portions of the PDG substrate to a ceramic phase to form ceramic in the vias in the PDG substrate; forming on a second side of the PDG substrate a second patterned photoresist layer with one or more second via patterns, wherein the one or more second via patterns are aligned with the one or more first via patterns on the first side of the PDG substrate; exposing the second side of the PDG substrate on which the second patterned photoresist layer has been formed to a UV energy that activates portions of the PDG substrate exposed to the UV energy; removing the second patterned photoresist layer; depositing a first titanium adhesion layer on the first side of the PDG substrate; depositing a first metal layer on the first titanium adhesion layer; chemically etching the second side of the PDG substrate to remove the ceramic in the vias; electroplating the PDG substrate to fill the vias with copper to form copper vias; lapping and polishing the first side of the PDG substrate; forming on the first side of the PDG substrate a third patterned photoresist layer to form a first plate; depositing a second titanium adhesion layer on the first side of the PDG substrate; depositing a second metal layer on the second titanium adhesion layer to form the first plate and to connect the copper vias formed on the first side to the first plate on the PDG substrate; etching away any remaining ceramic and glass to expose the copper vias and form air cavities therebetween; and forming a pad on each of the at least one of one or more control vias, one or more power vias, and one or more ground vias. In one aspect, the first or second metal layer, the heat conductive vias, the at least one of one or more control vias, one or more power vias, and one or more ground vias comprise Cu or Al.

In another embodiment, the present invention includes a thermal management and signal control structure made by each of the methods described hereinabove.

BRIEF DESCRIPTION OF THE DRAWINGS

Although embodiments of this invention have been fully described with reference to the accompanying drawings, it is to be noted that various changes and modifications will become apparent to those skilled in the art. Such changes and modifications are to be understood as being included within the scope of embodiments of this invention as defined by the appended claims.

For a more complete understanding of the features and advantages of the present invention, reference is now made to the detailed description of the invention along with the accompanying figures and in which:

FIG. 3A shows the second side of the photoresist pattern on the substrate of the present invention with one arrangement of pads, and FIG. 3B shows the second side of the photoresist pattern on the substrate of the present invention with another arrangement of pads.

FIG. 4 shows a top view of a completed structure of the present invention.

DETAILED DESCRIPTION OF THE INVENTION

While the making and using of various embodiments of the present invention are discussed in below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

Figure 1:
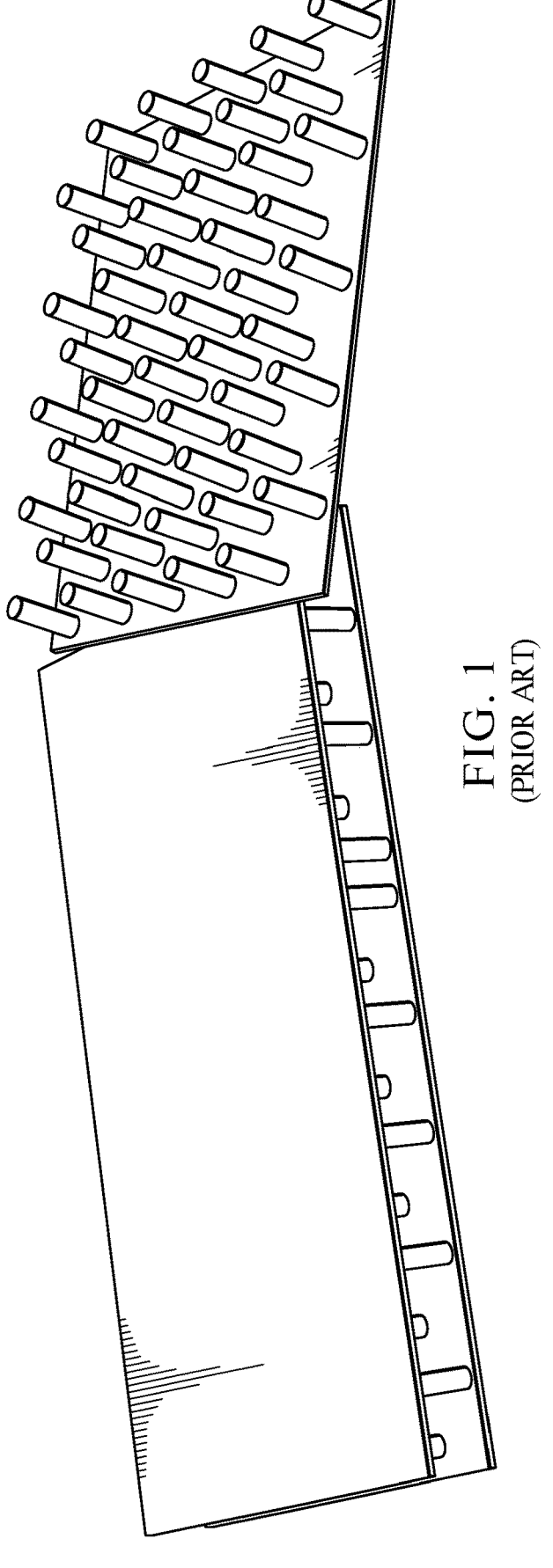
FIG. 1 shows a 3D copper heat spreader and ground plane of the prior art.

The present inventors have previously produced copper pillars as a substrate for as a heat spreader and ground plane. (See FIG. 1). The copper pillars provide increased heat dissipation, however, copper and related metals are electrically conductive, thus limiting their use to just heat dissipation.

The present invention provides both heat dissipation and interconnects between different active components, such as between printed circuit boards (PCBs), or between a PCB and a power management unit (PMU). The present invention enables the metal structures (pillars, fins) directly in or on the substrate where some of the structures can be used for electrical connectivity for signals (I/O), control voltage, and on chip ground and where the majority of the structures are used for thermal management, aka, heat spreading. The present invention is depicted using a photodefinable glass substrate, however, the concept can be extended to semiconductor, ceramic, sapphire and other substrates (which are also part of the present invention). However, one example is a photodefinable glass substrate that can be directly attached to other substrates that include: semiconductor, ceramic, sapphire and PCB substrates.

Figure 2:
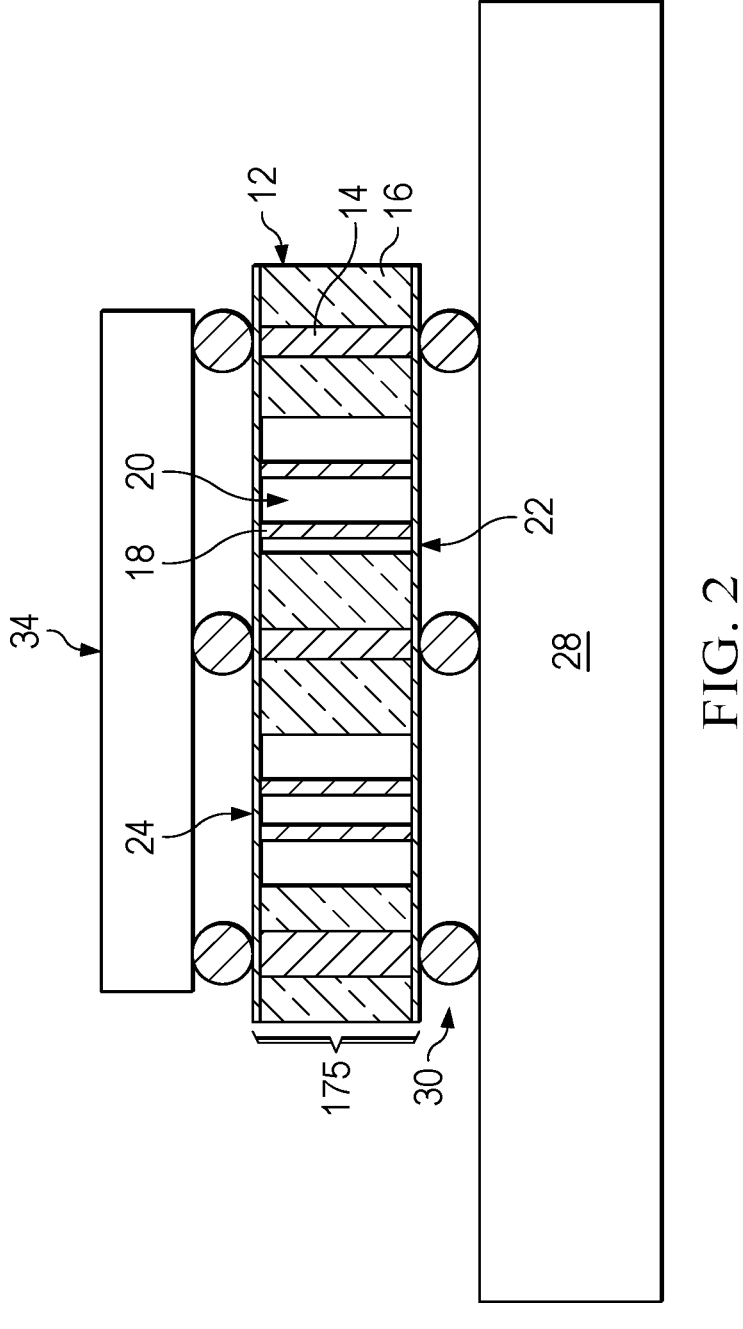
FIG. 2 shows a schematic of the cross section for the present invention.

FIG. 2 shows a cross-sectional view of an integrated circuit package 10 that includes a thermal management and electrical connectivity structure 12 of the present invention. In this example, the thermal management and electrical connectivity structure 12 of the present invention includes electrical connection vias 14 (e.g., for power, ground and control vias), each of which is surrounded by a glass support 16 (formed in a substrate, as described below), which can be a polygonal column or cylinder. Heat dissipating vias 18 (also called heat conductive vias herein) are shown separated from each other by air cavities 20. The heat dissipating vias 18 are connected to a first heat conductive plate 22 and second heat conductive plate 24, with which they can be integral. The thermal management and electrical connectivity structure 12 of the present invention is shown, in this embodiment, connecting the electrical connection vias 14 (e.g., for power, ground and control vias) to a printed circuit board 28 via solder balls 30. In addition, the thermal management and electrical connectivity structure 12 is connected on the opposite side of the PCB 28 to a power management unit 34, which can be a fan, heat sink, or other integrated circuit.

FIGS. 3A and 3B are top views of the thermal management and electrical connectivity structure 10 of the present invention. In FIG. 3A, the two control via pads 36a, b, one power via pad 37, and one ground via pad 38 are shown, in this example, to the left of the ground and thermal cover 39, which in a top view is the second heat conductive plate 24. However, the skilled artisan will recognize that the pads may be located on the opposite side (to the right of the second heat conductive plate 24), or the pads may be distributed around the second conductive plate 24, with matching pads on the first side of the thermal management and electrical connectivity structure 12, adjacent and electrically isolated from the first conductive plate 22. In FIG. 3B the two control via pads, one power via pad and one ground via pad are shown, in this example, adjacent to and below a ground and thermal cover, which in a top view is the second heat conductive plate 24, however, the skilled artisan will recognize that the pads may be located on the opposite side (on top of the second heat conductive plate 24), or the pads may be distributed around the second heat conductive plate 24, with matching pads on the first side of the thermal management and electrical connectivity structure 12, adjacent and electrically isolated from the first heat conductive plate 22.

FIG. 4 is a composite, top view of the final structure of the thermal management and electrical connectivity structure 12 of the present invention that shows, in this embodiment, two heat conductive plates 40, 42, on heat dissipation vias 44, and the glass isolation 46 surrounding the pads 48 of the two control vias pads, one power via pad and one ground via pad.

The thermal management and electrical connectivity structures are made by processing a photodefinable glass substrate (also called a photosensitive glass substrate or a photoetchable glass substrate herein), as taught herein by: exposing at least one portion of the photodefinable glass substrate to an activating energy source; heating the photodefinable glass substrate above its glass transition temperature for at least ten minutes; cooling the photodefinable glass substrate to transform at least part of the exposed glass to a crystalline material to form a glass-crystalline substrate;

etching the glass-crystalline substrate (trench(s) and via(s)) with an etchant; flood exposing the region outside of etched trenches and vias of the photodefinable glass substrate to an activating energy source; heating the photodefinable glass substrate above its glass transition temperature for at least ten minutes; cooling the photosensitive glass/ceramic substrate to transform the exposed glass to a crystalline material to form a glass-crystalline substrate; selectively fill the (trench(s) and via(s)) with a conductive material ground plane and input and output channels with one or more metals, wherein the metal is configured to be connected to a circuitry; and etching the ceramitized perimeter of the photodefinable glass to expose the filled trenches.

In an embodiment, the substrate is a photodefinable glass substrate comprising a composition of at least one of: 60-76 weight % silica; at least 3 weight % $K_2O$ with 6 weight %-16 weight % of a combination of $K_2O$ and $Na_2O$; 0.003-1 weight % of at least one oxide selected from the group consisting of $Ag_2O$ and $Au_2O$; 0.003-2 weight % $Cu_2O$; 0.75 weight %-7 weight % $B_2O_3$, and 6-7 weight % $Al_2O_3$; and the combination of $B_2O_3$; and $Al_2O_3$ not exceeding 13 weight %; 8-15 weight % $Li_2O$; and 0.001-0.1 weight % $CeO_2$. In another embodiment, the substrate is a photodefinable glass substrate comprising a composition of at least one of: 35-76 weight % silica, 3-16 weight % $K_2O$, 0.003-1 weight % $Ag_2O$, 8-15 weight % $Li_2O$, and 0.001-0.1 weight % $CeO_2$. In another aspect, the substrate is at least one of: a photodefinable glass substrate comprising at least 0.1 weight % $Sb_2O_3$ or $As_2O_3$; a photodefinable glass substrate comprising 0.003-1 weight % $Au_2O$; a photodefinable glass substrate comprising 1-18 weight % of an oxide selected from the group consisting of CaO, ZnO, PbO, MgO, SrO and BaO; and optionally a photodefinable glass substrate having an anisotropic-etch ratio of exposed portion to unexposed portion of at least one of 10-20:1; 21-29:1; 30-45:1; 20-40:1; 41-45:1; and 30-50:1. In another embodiment, the photodefinable glass substrate is a photodefinable glass ceramic composite substrate comprising at least one of silica, lithium oxide, aluminum oxide, or cerium oxide. In another embodiment, the electronic circuit. In another aspect, the method further comprises forming the mechanically and thermally stabilized structure into a feature of one or more passive and active components to form a bandpass filter, a low pass filter, a high pass filter, a shunt or a notch filter.

Microstructures have been produced relatively inexpensively with these glasses using conventional semiconductor processing equipment. In general, glasses have high temperature stability, good mechanical and electrical properties, and better chemical resistance than plastics and many metals. Photodefinable glass is comprised of lithium-aluminum-silicate glass containing traces of silver ions. When exposed to UV-light within the absorption band of cerium oxide, the cerium oxide acts as a sensitizer, absorbing a photon and losing an electron that reduces neighboring silver oxide to form silver atoms, e.g., $$Ce^{3+} + Ag^+ = Ce^{4+} + Ag^0$$

The silver atoms coalesce into silver nanoclusters during the baking process and induce nucleation sites for crystallization of the surrounding glass. If exposed to UV light through a mask, only the exposed regions of the glass will crystallize during subsequent heat treatment.

This heat treatment must be performed at a temperature near the glass transformation temperature (e.g., greater than 465° C. in air). The crystalline phase is more soluble in etchants, such as hydrofluoric acid (HF), than the unexposed vitreous, amorphous regions. The crystalline regions etched greater than 20 times faster than the amorphous regions in 10% HF, enabling microstructures with wall slopes ratios of about 20:1 when the exposed regions are removed. See T. R. Dietrich, et al., "Fabrication Technologies for Microsystems utilizing Photoetchable Glass", Microelectronic Engineering 30,497 (1996), relevant portions of which are incorporated herein by reference that discuss using microfluidics as a method to cool electronics.

The exposed portion may be transformed into a crystalline material by heating the glass substrate to a temperature near the glass transformation temperature. When etching the glass substrate in an etchant such as hydrofluoric (HF) acid, the anisotropic-etch ratio of the exposed portion to the unexposed portion is at least 30:1 when the glass is exposed to a broad spectrum mid-ultraviolet (about 308-312 nm) flood lamp to provide a shaped glass structure that have an aspect ratio of at least 30:1, and to provide a lens shaped glass structure. The exposed glass is then baked typically in a two-step process. Temperature range heated between of 420° C.-520° C. for between 10 minutes to 2 hours, for the coalescing of silver ions into silver nanoparticles and temperature range heated between 520° C.-620° C. for between 10 minutes and 2 hours allowing the lithium oxide to form around the silver nanoparticles. The glass plate is then etched. The glass substrate is etched in an etchant, of HF solution, typically 5% to 10% by volume, wherein the etch ratio of exposed portion to that of the unexposed portion is at least 30:1, creating etched features that will be filled with metals, dielectrics, and/or resistive elements combined with active devices to from circuits. The final processing steps prior to the creation of the electric circuits and structures in the photodefinable glass substrate is to fully convert the remaining glass substrate to a ceramic phase. The ceramicization of the glass is accomplished by exposing all of the remaining photodefinable glass substrate to approximately 20 J/cm' of 310 nm light then heating the substrate to a temperature between 420° C.-520° C. for up to 2 hours, for the coalescing of silver ions into silver nanoparticles, and then to a temperature between 520° C.-620° C. for between 10 minutes and 2 hours, allowing the lithium oxide to form around the silver nanoparticles. The substrate is then cooled and then processed to form metalized structures (interconnects, via and others). Finally, the active and passive devices are placed on to the ceramitized substrate.

Heat spreaders and heat sinks made in 100% copper can be made as small as 1 mm×1 mm, and as thin as 150 microns, enabling truly small packages. Copper has a higher thermal conductivity and conducts heat faster than aluminum. Therefore, the temperature across the heat spreader or heatsink will be more uniform. With a higher volumetric heat capacity than aluminum, it takes a larger quantity of energy to raise the temperature of copper, thus smoothing out the thermal load.

Copper heat sinks and heat spreaders better match the coefficient of thermal expansion (CTE) of the solder joints, which reduces fatigue failure from repeated, long-term thermal cycling. However, copper has a higher density and is traditionally more expensive than aluminum. Heat sinks and heat spreaders leverage the advantages of the copper and minimize the disadvantages (weight and expense). 100% copper heat spreaders outperform copper 'coin' designs as the mini pin fin's internal structure enables torsion relieving stresses from thermal cycling. Additionally, copper heat sinks and heat spreaders can be designed to integrate I/O signals within the package, enabling more functionality in a smaller footprint. The 35 micron mini pin fins enable effective thermal transfers of up to 100 W/m° C. This is far superior to the single piece copper coin solution which is limited by its inherent surface area.

The thermal management and signal control structures (TMSC) are created by:

| Step 1 | Side 1 of a photodefinable glass (PDG) Substrate 1 is coated with photoresist where one or more via patterns is/are created using standard photolithography processes. The one or more via patterns are aligned to a copper pattern on Side 1. The via spacing can range from 10 μm to 250 μm (preferably 35 μm) center to center spacing with a diameter ranging from 5 μm to 200 μm (preferably 20 μm) and a via depth from 25 μm to 1000 μm (preferably 300 μm). |
|---|---|
| Step 2 | The photoresist pattern is then exposed with at least 2 J/cm$^2$ of 310 nm light. The photoresist is then removed with a standard stripper. |
| Step 3 | The PDG substrate is then baked to 600° C. for at least 10 min to convert the UV exposed section to a ceramic phase. |
| Step 4 | Side 2 of the PDG Substrate is coated with photoresist and a pattern that includes control, power and ground vias are then created using standard photolithography processes. The control, power and ground via patterns are aligned with the via pattern on Side 1. See FIGS. 3A and 3B for two different examples of patterns for control(s), power(s) and ground via(s). Where the via spacing can range from 10 μm to 250 μm (preferably 50 μm) center to center spacing for the control, power and ground via patterns. |
| Step 5 | The pattern is then exposed with at least 150 mJ/cm$^2$ of 310 nm light. The photoresist pattern is then removed with a standard stripper to expose the patterns shown in FIGS. 3A and 3B. |
| Step 6 | The exposed regions of the PDG Substrate are coated with a titanium adhesion layer that is deposited on the surface of Side 1 of the photodefinable glass (PDG) Substrate 1 followed by a 2 μm layer of copper (Cu). The titanium (Ti) can be deposited by a number of different techniques including but not limited to sputtering, e-beam evaporation PLD and or CVD. The thickness of the Ti layer can range from 5 nm to 200 nm preferably 100 nm. The thickness of the Cu layer can range from 200 nm to 1,000 nm, preferably 500 nm. |
| Step 7 | The ceramic phase is then removed down to the copper plated region on Side 2, using a chemical etch with 10% HF solution. |
| Step 8 | PDG Substrate is then place into an electroplating bath where the vias are filled with copper. |
| Step 9 | The Side 1 surface of the PDG Substrate is lapped and polished flat and smooth. |
| Step 10 | The Side 1 of the PDG Substrate is coated with photoresist where a pattern is then created using standard photolithography processes to expose the region of the glass with the thermal management pillars. See FIG. 4. |
| Step 11 | The exposed regions of the PDG Substrate are coated with Depositing a titanium adhesion layer on surface of Side 1 of the photodefinable glass (PDG) Substrate 1 followed by a 2 μm layer of copper (Cu). The titanium (Ti) can be deposited by a number of different techniques including but not limited to sputtering, e-beam evaporation PLD and or CVD. The thickness of the Ti layer can range from 5 nm to 200 nm preferably 100 nm. The thickness of the Cu layer can range from 200 nm to 1,000 nm, preferably 500 nm. See FIG. 4. |
| Step 12 | The structure is then place into a 10% HF solution to remove the remainder of the glass and/or ceramic. |
| Step 13 | Using an ink jet or other solder ball deposition system place a solder ball to attach the die, packaged die or other devices. A solder ball is then applied to each of the copper filled via. The solder balls are placed Side 2 of Substrate 1 on the low frequency part of the BBI. The Solder acts as an electrical, thermal and mechanical connection between thermal management and control structure and the PCB and IC. See FIG. 2. |
| Step 14 | Attach the thermal management and control device (TMCD) to the PCB or other substrate. Then attach the integrated circuit (IC) or the packaged IC to the TMCD. |

It will be understood that particular embodiments described herein are shown by way of illustration and not as limitations of the invention. The principal features of this invention can be employed in various embodiments without departing from the scope of the invention. Those skilled in the art will recognize or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. In embodiments of any of the compositions and methods provided herein, "comprising" may be replaced with "consisting essentially of" or "consisting of". As used herein, the phrase "consisting essentially of" requires the specified integer(s) or steps as well as those that do not materially affect the character or function of the claimed invention. As used herein, the term "consisting" is used to indicate the presence of the recited integer (e.g., a feature, an element, a characteristic, a property, a method/process step or a limitation) or group of integers (e.g., feature(s), element(s), characteristic(s), property(ies), method/process steps or limitation(s)) only.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skill in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

To aid the Patent Office, and any readers of any patent issued on this application in interpreting the claims appended hereto, applicants wish to note that they do not intend any of the appended claims to invoke paragraph 6 of 35 U.S.C. § 112, U.S.C. § 112 paragraph (f), or equivalent, as it exists on the date of filing hereof unless the words "means for" or "step for" are explicitly used in the particular claim.

For each of the claims, each dependent claim can depend both from the independent claim and from each of the prior dependent claims for each and every claim so long as the prior claim provides a proper antecedent basis for a claim term or element.

What is claimed is:

1. A method of making a thermal management and electrical connectivity structure comprising:

forming on a first side of a photodefinable glass (PDG) substrate a plurality of vias capable of serving as one or more heat conductive vias and at least one of one or more control vias, one or more power vias, and one or more ground vias, by:

forming a first patterned photoresist layer with one or more first via patterns on the first side of the PDG substrate, exposing the first patterned photoresist layer to a UV energy to activate exposed portions of the PDG substrate, removing the first patterned photoresist layer, and baking the PDG substrate to convert the exposed portions of the PDG substrate to a ceramic phase to form ceramic vias in the PDG substrate;

forming on a second side of the PDG substrate the one or more heat conductive vias and the at least one of one or more control vias, one or more power vias, and one or more ground vias, by:

forming a second patterned photoresist layer with the one or more via patterns on the second side of the PDG substrate, wherein the one or more second via patterns on the second side are aligned with the one or more first via patterns on the first side, exposing the second patterned photoresist layer to a UV energy that activates exposed portions of the PDG substrate, removing the second patterned photoresist layer, chemically etching the second side of the PDG substrate to remove the ceramic vias down to a metal plate pattern on the second side of the PDG substrate, depositing a first titanium adhesion layer on the PDG substrate, depositing a copper layer on the first titanium adhesion layer, and electroplating the PDG substrate to fill the one or more heat conductive vias and the at least one of one or more control vias, one or more power vias, and one or more ground vias with copper to form copper vias;

forming on the first side of the PDG substrate a heat conductive plate by:

forming a third patterned photoresist layer, and depositing a second titanium adhesion layer on the first side of the PDG substrate;

depositing a copper layer on the second titanium adhesion layer to form the heat conductive plate and to connect the one or more heat conductive vias formed on the first side to the heat conductive plate on the PDG substrate; and etching away any remaining ceramic and glass to expose the copper vias and form air cavities therebetween, wherein a glass column surrounds and provides at least one of electrical isolation or mechanical support to the at least one of one or more control vias, one or more power vias, and one or more ground vias.

2. The method of claim 1, wherein the PDG substrate is a semiconductor, ceramic, sapphire, or a photodefinable material.

3. The method of claim 1, wherein the PDG substrate comprises a composition of: 60 to 76 weight % silica; at least 3 weight % $K_2O$ with 6 to 16 weight % of a combination of $K_2O$ and $Na_2O$; 0.003 to 1 weight % of at least one oxide selected from the group consisting of $Ag_2O$ and $Au_2O$; 0.003 to 2 weight % $Cu_2O$; 0.75 to 7 weight % $B_2O_3$, and 6 to 7 weight % $Al_2O_3$; and the combination of $B_2O_3$; and $Al_2O_3$ not exceeding 13 weight %; 8 to 15 weight % $Li_2O$; and 0.001 to 0.1 weight % $CeO_2$.

4. The method of claim 1, wherein the PDG substrate comprises a composition of: 35 to 76 weight % silica, 3 to 16 weight % $K_2O$, 0.003 to 1 weight % $Ag_2O$, 8 to 15 weight % $Li_2O$, and 0.001 to 0.1 weight % $CeO_2$.

5. The method of claim 1, wherein the PDG substrate is at least one of: a PDG substrate comprising at least 0.1 weight % $Sb_2O_3$ or $As_2O_3$; a PDG substrate comprising 0.003 to 1 weight % $Au_2O$; or a PDG substrate comprising 1 to 18 weight % of an oxide selected from the group consisting of CaO, ZnO, PbO, MgO, SrO and BaO; and a PDG substrate having an anisotropic-etch ratio of exposed portion to the unexposed portion of at least one of 10 to 20:1; 21 to 29:1; 30 to45: 1; 20 to 40:1; 41 to 45:1; and 30 to 50:1.

6. The method of claim 1, wherein the PDG substrate is a photosensitive glass ceramic composite substrate comprising at least one of silica, lithium oxide, aluminum oxide, or cerium oxide.

7. The method of claim 1, further comprising forming the thermal management and electrical connectivity structure into a feature of at least one or more electronic circuits, or one or more passive and active components to form a bandpass filter, a low-pass filter, a high-pass filter, a shunt, or a notch filter.

8. The method of claim 1, wherein a center-to-center spacing between the vias of the plurality of vias capable of serving as one or more heat conductive vias is 10, 20, 25, 30, 35, 40, 50, 60, 70, 75, 80, 90, 100, 125, 150, 175, 200, 225 or 250 μm, wherein each heat conductive via has a diameter of 5, 10, 20, 25, 30, 35, 40, 50, 60, 70, 75, 80, 90, 100, 125, 150, 175, to 200 μm, and wherein each heat conductive via has a via depth of 25, 30, 35, 40, 50, 60, 70, 75, 80, 90, 100, 125, 150, 175, 200, 225, 250, 300, 400, 500, 600, 800, 900, or 1000 μm.

9. The method of claim 1, wherein a center-to-center spacing of the vias capable of serving as the at least one of one or more control vias, the one or more power vias, and the one or more ground vias is 10, 20, 25, 30, 35, 40, 50, 60, 70, 75, 80, 90, 100, 125, 150, 175, 200, 225 or 250 μm for the control, power, and ground via patterns.

10. The method of claim 1, wherein the metal layer, the vias capable of serving as the one or more heat conductive vias and the at least one of one or more control vias, the one or more power vias, and the one or more ground vias comprise Cu or Al.

11. The method of claim 1, wherein the metal layer, the vias capable of serving as the one or more heat conductive vias and the at least one of one or more control vias, the one or more power vias, and the one or more ground vias have a thickness of 100, 200, 300, 400, 500, 600, 700, 800, 900, or 1,000 nm.

12. The method of claim 1, further comprising forming a pad on each of the vias capable of serving as the at least one of one or more control vias, one or more power vias, and one or more ground vias on the first and second side of the PDG substrate.

13. The method of claim 12, further comprising electrically connecting each pad on the first and second sides of the thermal management and electrical connectivity structure to at least one of: a printed circuit board, an integrated circuit, or a power management unit.

14. A method of making a thermal management and electrical connectivity structure comprising:

forming on a first side of a photodefinable glass (PDG) substrate a first patterned photoresist layer with one or more first via patterns that comprise a plurality of vias capable of serving as one or more heat conductive vias and at least one of one or more control vias, one or more power vias, and one or more ground vias, wherein the one or more first via patterns are aligned to a metal plate pattern on the first side of the PDG substrate;

exposing the first side of the PDG substrate on which the first patterned photoresist layer has been formed to a UV energy that activates portions of the PDG substrate exposed to the UV energy;

removing the patterned photoresist layer;

baking the PDG substrate to convert the UV-exposed portions of the PDG substrate to a ceramic phase to form ceramic in the vias in the PDG substrate;

forming on a second side of the PDG substrate a second patterned photoresist layer with one or more second via patterns, wherein the one or more second via patterns are aligned with the one or more first via patterns on the first side of the PDG substrate;

exposing the second side of the PDG substrate on which the second patterned photoresist layer has been formed to a UV energy that activates portions of the PDG substrate exposed to the UV energy;

removing the second patterned photoresist layer;

depositing a first titanium adhesion layer on the first side of the PDG substrate;

depositing a first metal layer on the first titanium adhesion layer;

chemically etching the second side of the PDG substrate to remove the ceramic in the vias;

electroplating the PDG substrate to fill the vias with copper to form copper vias;

lapping and polishing the first side of the PDG substrate;

forming on the first side of the PDG substrate a third patterned photoresist layer to form a first plate;

depositing a second titanium adhesion layer on the first side of the PDG substrate;

depositing a second metal layer on the second titanium adhesion layer to form the first plate and to connect the copper vias formed on the first side to the first plate on the PDG substrate;

etching away any remaining ceramic and glass to expose the copper vias and form air cavities therebetween; and forming a pad on each of the at least one of one or more control vias, one or more power vias, and one or more ground vias.

15. The method of claim 14, wherein the first or second metal layer, the vias capable of serving as the one or more heat conductive vias and the at least one of one or more control vias, one or more power vias, and one or more ground vias comprise Cu or Al.

\* \* \* \* \*